(12) United States Patent
Sadri et al.

(10) Patent No.: US 11,690,169 B2
(45) Date of Patent: *Jun. 27, 2023

(54) THERMAL MANAGEMENT FOR THERMAL CYCLERS USING AIR TUBES

(71) Applicant: Bio-Rad Laboratories, Inc., Hercules, CA (US)

(72) Inventors: Amir Sadri, Hercules, CA (US); Neven Nikolic, Hercules, CA (US); Gabriel Culinco, Hercules, CA (US); Thanh-Vi Tran, Hercules, CA (US); Nenad Kircanski, Hercules, CA (US)

(73) Assignee: Bio-Rad Laboratories, Inc., Hercules, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/841,931

(22) Filed: Jun. 16, 2022

(65) Prior Publication Data
US 2022/0312586 A1    Sep. 29, 2022

Related U.S. Application Data

(63) Continuation of application No. 17/102,027, filed on Nov. 23, 2020, now Pat. No. 11,375,612.
(Continued)

(51) Int. Cl.
*H05K 7/20* (2006.01)
*H05K 1/02* (2006.01)

(52) U.S. Cl.
CPC ....... *H05K 1/0272* (2013.01); *H05K 7/20145* (2013.01); *H05K 7/20163* (2013.01);
(Continued)

(58) Field of Classification Search
CPC . H01L 23/4012; G06F 1/20; G06F 2200/201; F28D 2021/0029;
(Continued)

(56) References Cited

U.S. PATENT DOCUMENTS 4,848,090 A * 7/1989 Peters ................ F25B 21/02
236/78 B
6,778,390 B2   8/2004 Michael
(Continued)

FOREIGN PATENT DOCUMENTS

WO       1989/12502 A1    12/1989

OTHER PUBLICATIONS

International Search Report and Written Opinion in PCT Appln. PCT/US2020/061853 dated Feb. 26, 2021; 7 pages.

*Primary Examiner* — Mandeep S Buttar
(74) *Attorney, Agent, or Firm* — Kilpatrick Townsend and Stockton LLP

(57) ABSTRACT

A thermal management system that include an electronic circuit boards having at least two circuit boards with a space in between and further includes one or more air tubes or conduits. The electronic circuit board and air tubes are configured for drawing air into the space to facilitate cooling of the electronic circuit board concurrent with cooling of a heat sink of a heat pump connected with the electronic circuit board. The system can further include a partition to isolate airflow from the heat sink from airflow through the electronics circuit board, and can further include one or
(Continued)

more interface components for maintaining isolation and control of air flow, improving air intake and/or supporting auxiliary components.

**22 Claims, 16 Drawing Sheets
(1 of 16 Drawing Sheet(s) Filed in Color)**

Related U.S. Application Data

(60) Provisional application No. 62/939,419, filed on Nov. 22, 2019.

(52) U.S. Cl.
CPC ... *H05K 7/20209* (2013.01); *H05K 2201/064* (2013.01); *H05K 2201/066* (2013.01)

(58) Field of Classification Search
CPC .......... H05K 7/20145; H05K 7/20163; H05K 2201/066; H05K 7/20209; H05K 2201/064; H05K 1/0272
USPC .............. 361/715, 679.47; 165/104.33, 80.3; 310/64, 60 A
See application file for complete search history.

(56) References Cited

U.S. PATENT DOCUMENTS

| | | | |
|---|---|---|---|
| 6,934,152 B1* | 8/2005 | Barrow | H05K 7/1461 361/744 |
| 8,125,778 B2 | 2/2012 | Miyoshi | |
| 2006/0065652 A1 | 3/2006 | Brown | |
| 2006/0120043 A1 | 6/2006 | Wolford et al. | |
| 2008/0026483 A1 | 1/2008 | Oldenburg | |
| 2009/0284931 A1* | 11/2009 | Babock | H05K 7/20918 361/716 |
| 2009/0293499 A1* | 12/2009 | Bell | F25B 21/02 62/3.2 |
| 2012/0008276 A1 | 1/2012 | Cheng | |
| 2014/0211421 A1* | 7/2014 | Mishrikey | H05K 1/0209 361/717 |
| 2019/0320555 A1* | 10/2019 | Flavin | H05K 7/20409 |
| 2021/0237087 A1* | 8/2021 | Ahr | B01L 7/52 |

* cited by examiner

THERMAL MANAGEMENT FOR THERMAL CYCLERS USING AIR TUBES

CROSS-REFERENCE TO RELATED APPLICATIONS

The present application is a continuation of U.S. application Ser. No. 17/102,027 filed Nov. 23, 2020, which claims priority to U.S. Provisional Application No. 62/939,419, entitled "THERMAL MANAGEMENT FOR THERMAL CYCLERS USING AIR TUBES" and filed Nov. 22, 2019, the entire contents of each being incorporated herein by reference for all purposes.

BACKGROUND OF THE INVENTION

1. Field of the Invention

This invention pertains to thermal management for thermal cycling systems, such as heat pumps and heat sink assemblies.

2. Description of the Prior Art

Conventional heat pumps typically include a control unit with an electronics circuit board with electrical components that generate significant heat during thermal cycling of the heat pump. Such system generally utilize independent active cooling features, typically electronics fans, for cooling of the electronics circuit board. In addition, since the electronics can act as heat sources, the circuit board is often located remotely and attached to the heat pump through wires. This approach further increases the size, complexity and demands of the overall system. Thus, there exists a need to further simplify the thermal management of such heat pump systems as well as reduce the complexity and minimize the occupied size of such thermal cycling systems and associated control systems.

BRIEF SUMMARY

In one aspect, the present invention provides a thermal management solution capable of dissipating the heat from an electronics board assembly controlling a heat pump while simultaneously controlling the temperature of a heat sink of the heat pump.

In some embodiments, the present invention includes one or more air tubes or conduits that pull air from the back of the instrument by creating a negative pressure. In some embodiments, the invention includes at least two air tubes or conduits, one on each side of the electronic board assembly. The air then travels through the one or more air tubes and flows into an electronics board assembly thereby providing cooling of the components inside the assembly. The above-described approach simultaneously pulls air from the front of the instrument through the heat sink of the heat pump of the thermocycler as well. The air tubes or conduits can take various cross-sectional shapes (e.g. round, oval, square, rectangular, triangular, a regular polygon, an irregular polygon, or any suitable shape, or combination of shapes). While typically, the air tubes or conduits are straight, it is appreciated they can be curved or can extend along a varied path. The air tubes or conduits can be made out of any suitable material, including but not limited to: polymers (e.g. plastic), metals (e.g. aluminum), ceramic, or composites. In some embodiments, the one or more tubes or conduits can be added to an existing assembly. In other embodiments, the one or more tubes or conduits can be integrated within the assembly, for example integrated within the chassis of the instrument. In some embodiments, the one or more tubes of conduits can be formed of a thermally conductive material (e.g. metal, such as aluminum) so as to provide heat sinking of some other parts which are thermally coupled with the one or more tubes or conduits.

In some embodiments, the electronics board assembly is defined by at least two electronic printed circuit boards (PCBs), one of which includes high power electrical components that act as heat sources during thermal cycling operation. The air flowing between the PCBs dissipates heat from these heat sources. The main advantage of such a system is that one or more fans, typically two fans located at the back of the instrument, can be used to create laminar flow through the heat sink while the air tubes draws in air between the PCBs that dissipates heat from the electronics onboard. This approach is advantageous since no independent cooling system is required to dissipate heat from the electronic components.

Due to the relatively high impedance of the heat sink, a proper airflow ratio should be maintained between the heat sink and the electronics board assembly. In addition, due to direct contact between the heat pump and thermal board assembly, some of the heat generated by high electrical current in the heat pumps is transferred to the thermal board assembly which is ultimately dissipated to outside. Thus, the thermal solution described-above can effectively reduce the heat generated by the heat pump and the control circuit board assembly concurrently. In another aspect, this approach can also minimize non-uniformity of the sample block of the heat pump by reduction of the heat generated in the high current circuitry of the PCBs at the top surface of the heat pump. The conformable nature of this approach permits its use even in applications where space is limited. Another benefit of this approach is that it allows the one or more the cooling fans to be positioned elsewhere (for example, at the back, underneath or at the sides of the instrument) which leaves space in the front of the instrument available for other auxiliary components, such as LCD, cables, etc.

In some embodiments, the thermal management assembly includes one or more partition plates between the electronics board assembly and the heat sink in order to separate the airflow coming from the heat sink and the airflow drawn through the circuit board assembly. This approach advantageously provides isolation between temperature-elevated air coming from the heat sink and the electronic components. Due to the high efficiency of such systems, hermetic seals are typically not required between different components of the thermal management assembly.

Another object of the present invention is the provision of maintaining stability or minimizing temperature fluctuation of the thermal board assembly in order to minimize failure of the board even at the temperature-elevated environment.

Another technical advantage of the system is that the thermal boards can be directly coupled with the heat pump, thereby reducing or eliminating any cable routing that might obstruct airflow. This approach also allows building of an assembly that includes a heat pump, thermal boards, fans, and air tubes or conduits as a module. Providing this assembly as a module is convenient for both manufacturing and service as the module can be removed for repair or replaced.

In one aspect, the thermal management assembly described herein provides thermal management without the need of any hood or enclosure. The assembly can embodied by at least two PCBs that are sandwiched together and directly interface with the heat pump of a thermocycling system.

In another aspect, the components of a thermal management system are not cooled sequentially, as often seen in certain conventional systems, but rather the heat pump and the electronics board assembly are cooled concurrently or simultaneously.

In yet another aspect, the thermal management device provides thermal management without requiring any moving of the sample. For example, the assembly provides thermal management without requiring any application of centrifugal force, as found in certain conventional systems. There is no reason to move the sample during thermal cycling since the heat pump and electronics board assembly can be cooled simultaneously or concurrently.

In some embodiments, the cooling system is relatively planar, which contrasts with cooling systems designed for test tubes, and which allows for reduced size as compared to certain conventional systems having additional external cooling components attached thereto.

Various aspects of the present invention can be further understood by referring to the following figures.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION

Figure 1:
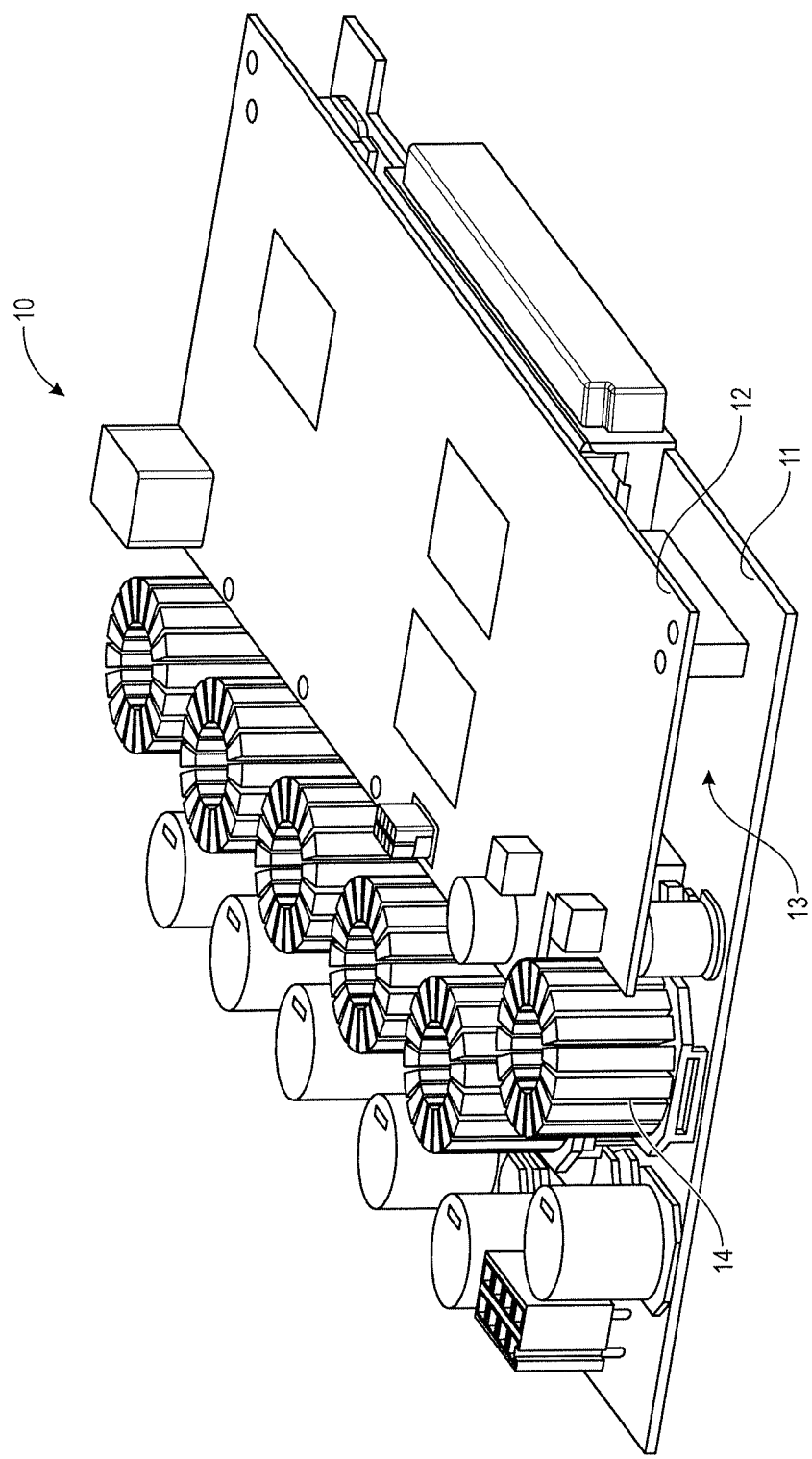
FIG. 1 depicts an electronics board assembly for control of a heat sink in a heat pump that can be used with a thermal management assembly, in accordance with some embodiments.
Figure 2:
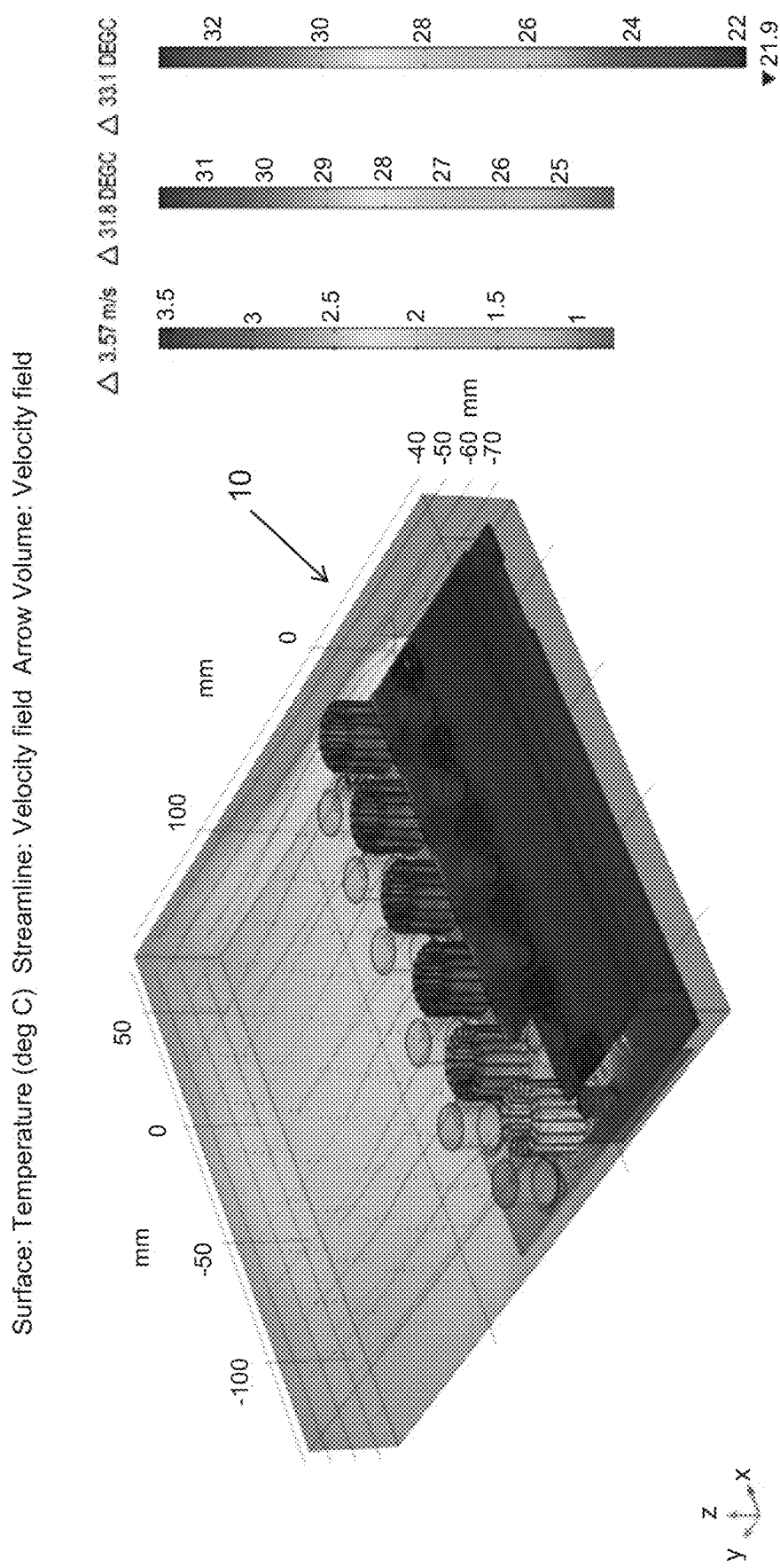
FIG. 2 depicts a thermal simulation of the electronics board assembly of FIG. 1 during thermal cycling.

In one aspect, the present invention provides a thermal management assembly that dissipates the heat from an electronics board control assembly while simultaneously or concurrently controlling the temperature of a heat sink of a heat pump for thermocycling. An example of an electronic board assembly suitable for use in such an assembly is shown in FIG. 1. The electronics board assembly 10 is configured with a thermal controller and driver board for controlling thermal cycling. The electronics board assembly 10 includes two PCBs 11, 12 with a space 13 therebetween. At least one PCB 11 includes high-powered electrical components 14. As can be seen in FIG. 2, which shows a thermal simulation of the electronic board assembly 10 during thermal cycling operation, the high powered components 14 can generate significant heat during operation such that cooling of the electronic board assembly is needed. In this embodiment, the electronic board assembly is configured to be directly connected to a heat pump assembly such that no extra wiring is required.

FIG. 3 shows a thermal management assembly that includes the electronic board assembly 10 directly connected to a heat pump assembly 20 having a heat sink. The assembly further includes a pair of air tubes 30, one on each side of the electronics circuit board assembly 10. The heat pump can be that described in U.S. Provisional Application No. 62/792,345 filed Jan. 14, 2019, which is incorporated herein by reference for all purposes, or it can be various other heat pumps. The assembly can further include one or more partitions 40 that separate the airflow from the heat sink and the airflow through the electronic boards assembly 10. Both airflows can be effected by a common airflow source, such as a fan or a set of fans. The airflow source can be controlled based on one or more temperature sensor outputs at various locations or surfaces (e.g. heat sink, sample holder surface, etc.).

Figure 3A:
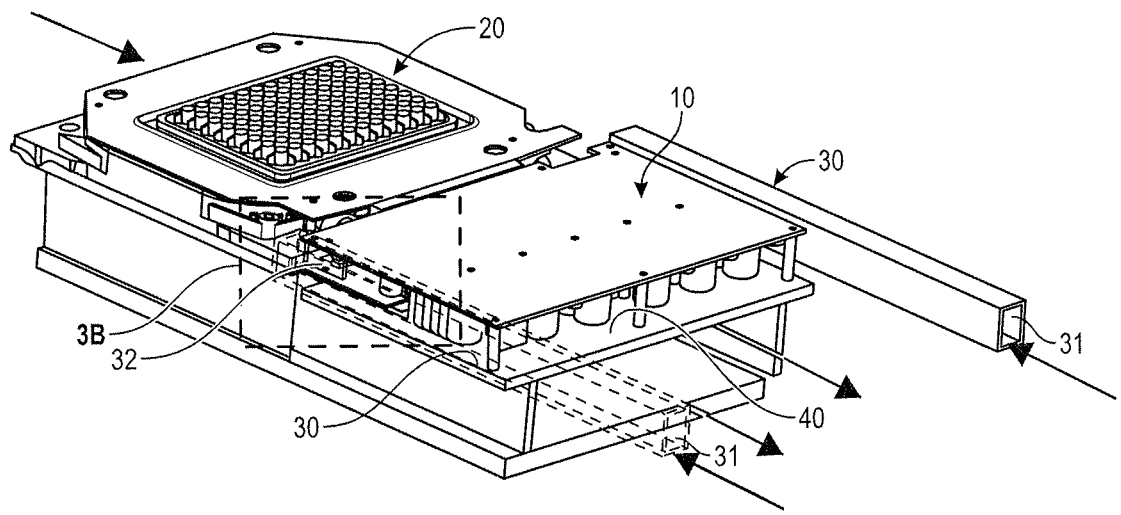
FIG. 3A-3B depicts a heat pump setup in which an electronics board assembly of FIG. 1 is directly connected with a heat pump and a pair of air tubes on opposite sides of the electronics boards assembly are configured for cooling therethrough.
Figure 3B:
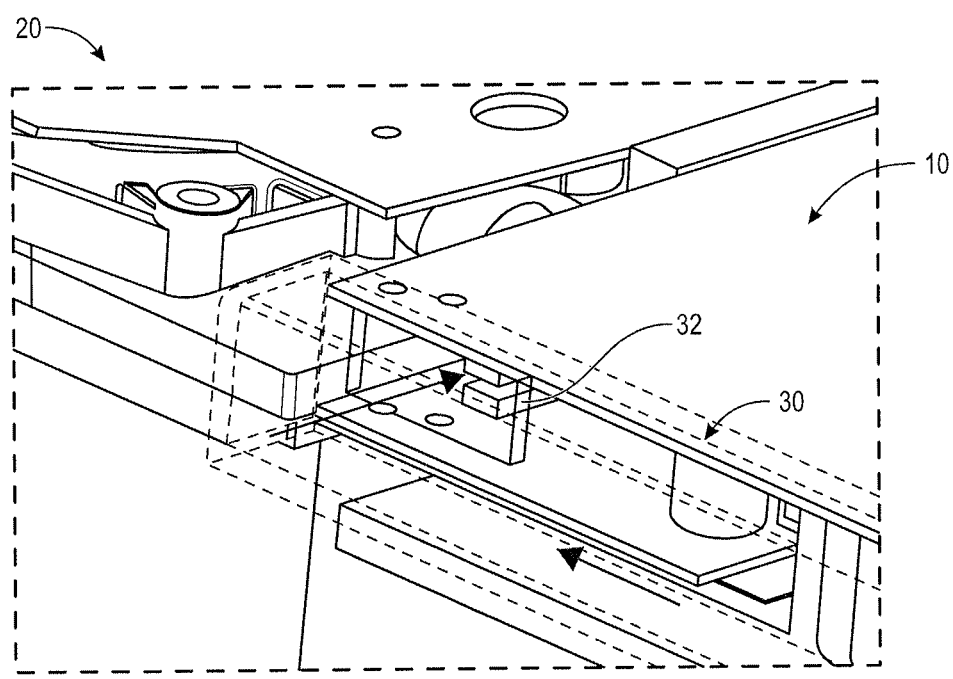
Figure 4:
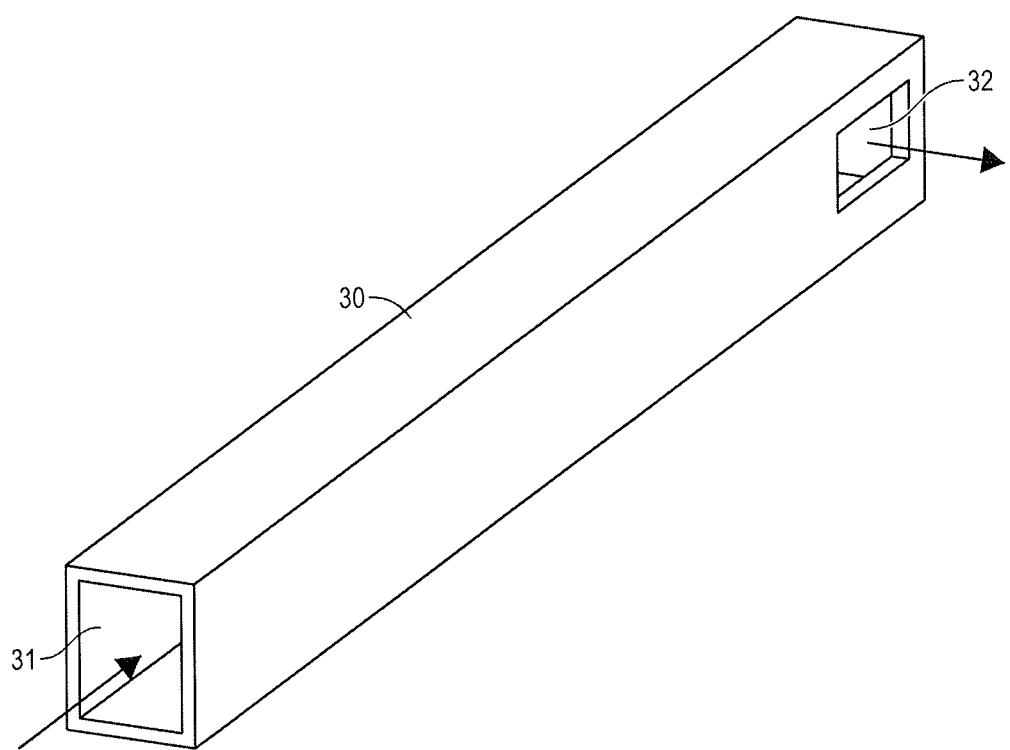
FIG. 4 depicts a detail view of an air tube configured for cooling of the electronics board assembly as shown in FIGS. 3A-3B.

The pair of air tubes 30 pull air from the back of the instrument when a negative pressure is created within the space in between PCBs. The air then travels through the two air tubes and flows into the space between the PCB of the electronic board assembly, thereby cooling the components within before exiting at the rear of the assembly, as shown by the arrows in FIG. 3A. The assembly simultaneously pulls air from the front of the instrument through the heat sink of the heat pump of the thermocycler as well, as shown by the arrows in FIG. 3A. As can be seen in FIGS. 3A-3B, each of the pair of air tubes 30 includes an outlet 32 positioned near the heat pump and an intake 31 positioned toward a rear of the assembly furthest from the heat pump. As can be seen in the detail view of FIG. 3B, the outlet 32 faces inward so as to direct the cooling air drawn through the air tube into the space between the PCBs. A detail view of an exemplary air tube or conduit 30 is shown in FIG. 4 (see arrows indicating airflow during cooling operation).

Figure 5A:
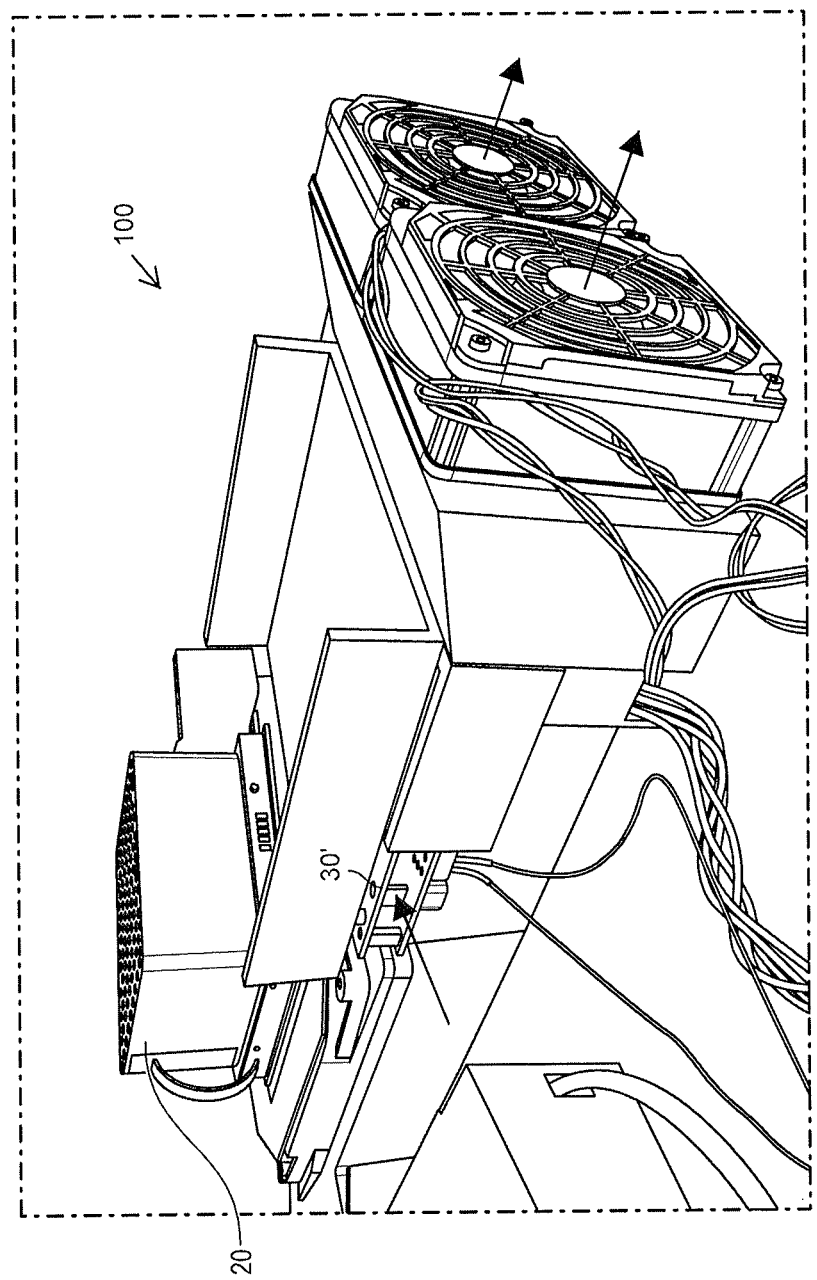
FIGS. 5A-5C depict a thermal management assembly test setup in accordance with some embodiments.
Figure 5B:
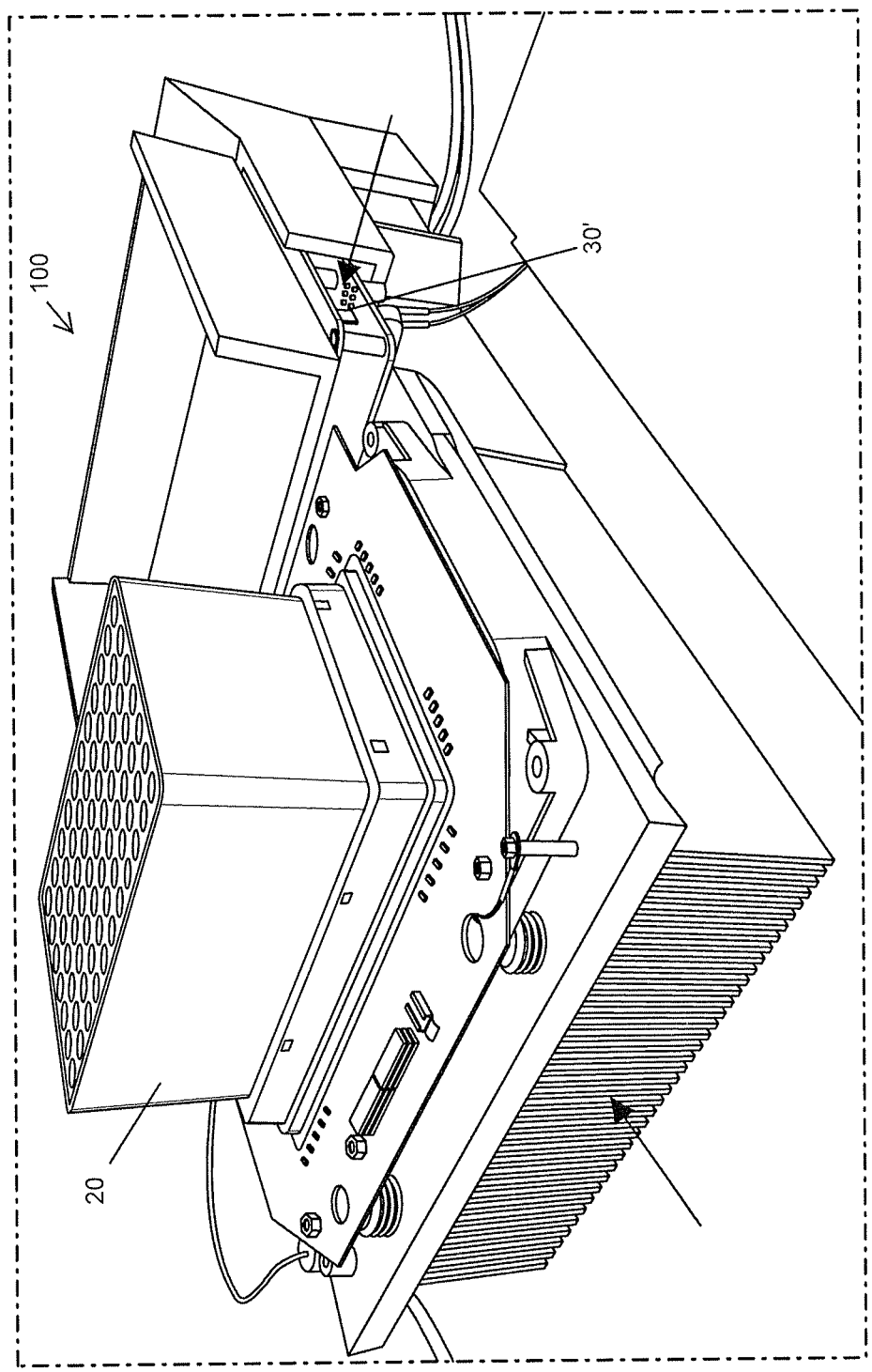
Figure 5C:
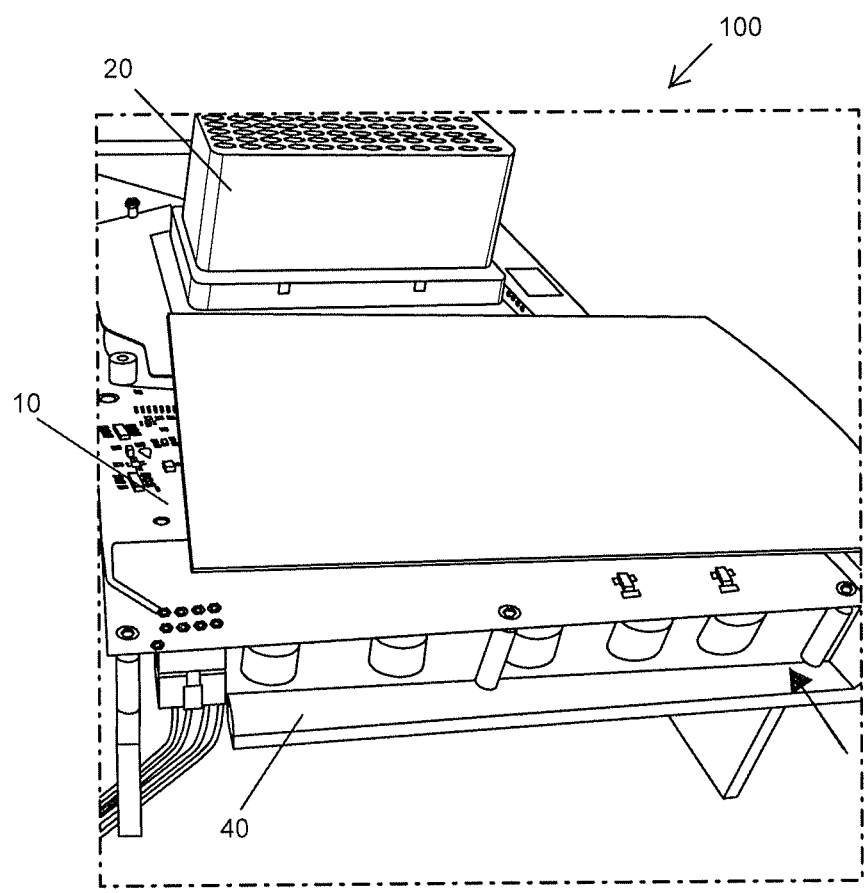
Figure 6:
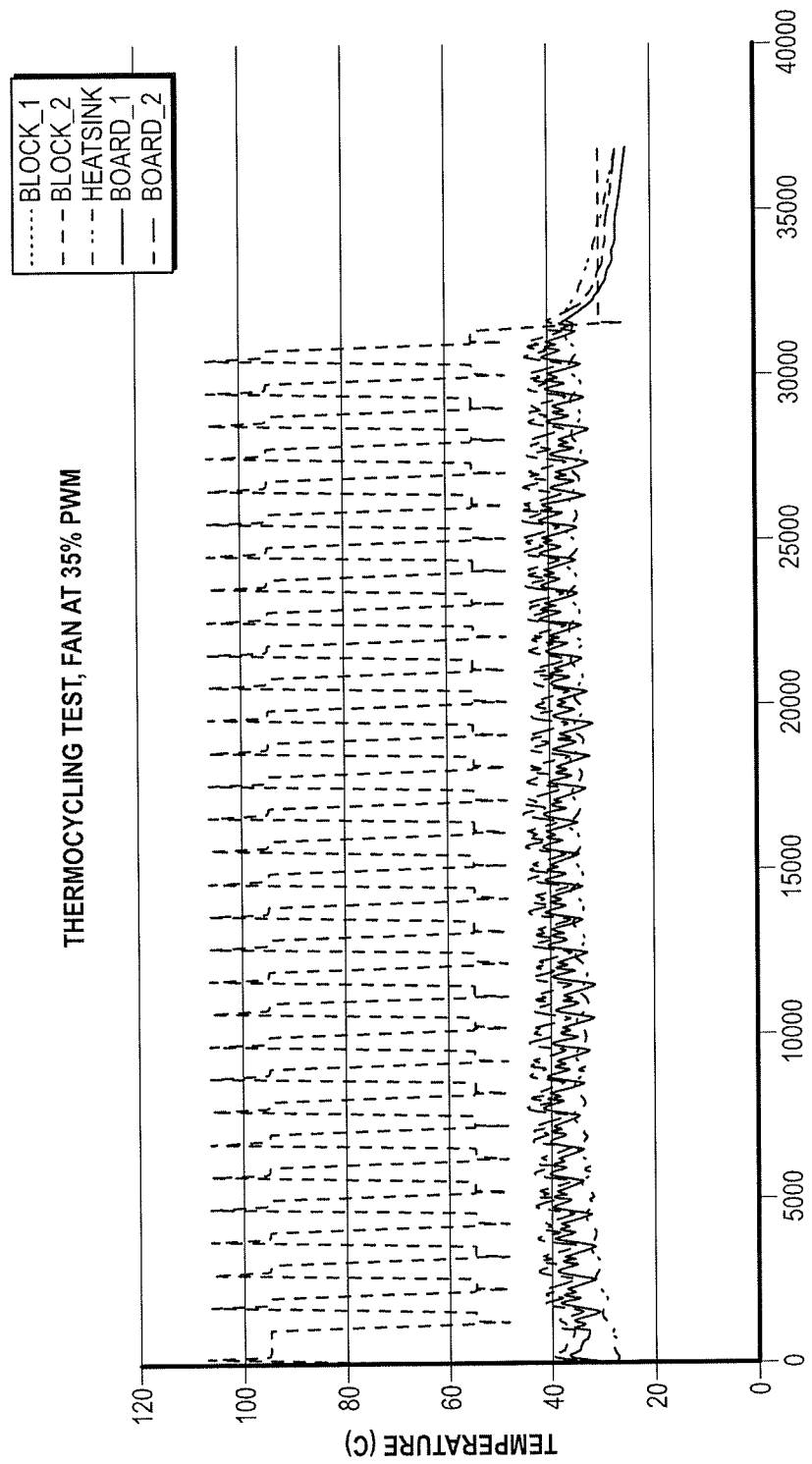
FIG. 6 shows initial thermal tests of the setup in FIGS. 5A-5C.

The main advantage of such an assembly is that one or more fans can be located elsewhere (for example, at the back of the assembly) to create laminar flow through the heat sink and create a negative pressure so that the one or more air tubes provide cooling air through the electronic board assembly. An example of such an assembly is shown in FIGS. 5A-5C, which shows two fans located at the base of the assembly. FIG. 6 shows a thermocycling test of the assembly shown in FIGS. 5A-5C.

By this approach, no independent cooling system is required to dissipate heat from the electronic components. The speed of the fans can be controlled by sensing the temperature of the heat sink. The fans can be controlled by various means, for example, by PWM signals, changing voltage or any suitable method. The fan speed can also be influenced (e.g., adjusted or modified) based on the temperature of critical parts on the driver board of the electronics board assembly. In another aspect, the fan speed can be further influenced based on an input air temperature that can be measured within the one or more air tubes.

Due to the relatively high impedance of the heat sink, a proper airflow ratio is maintained between the heat sink and the electronic board's assembly. In addition, due to direct contact between the heat pump and thermal board assembly, some of the heat generated by high electrical current in the heat pumps is transferred to the thermal board assembly which will be ultimately dissipated to outside. Thus, the thermal solution can effectively reduce the heat generated by the heat pump and the board assembly at the same time and also minimize non-uniformity of the sample block of the heat pump by reduction of the heat generated in the high current circuitry of the PCB at the top surface of the heat pump. The conformable nature of the thermal solution described herein permits its use even in applications where space is limited.

In some embodiments, the thermal management assembly includes a partition plate between the electronics board assembly and the heat sink in order to separate the airflow coming out of the heat sink and the board assembly. This component is particularly advantageous in providing isolation between temperature-elevated air coming from the heat sink and the electronic components. Due to the high efficiency of such systems, hermetic seals are not required between different components of the thermal solution. Another advantage of this system is the provision of maintaining stability or minimizing temperature fluctuation of the thermal board assembly in order to minimize failure of the board even at the temperature-elevated environment.

Figure 10:
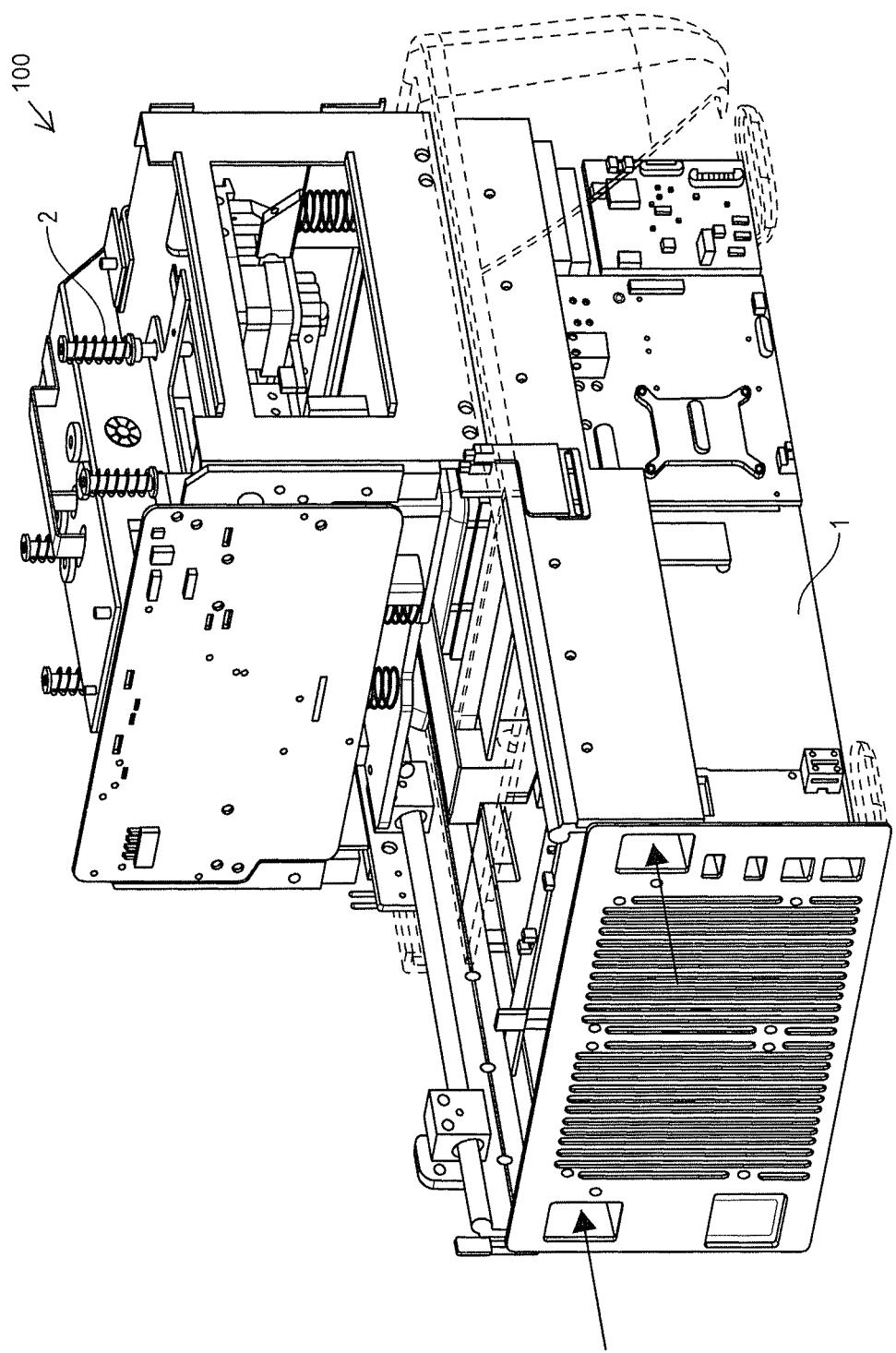
FIG. 10 shows a system having a thermal management module and analysis module, in accordance with some embodiments.

In addition, another benefit of such a solution is that it allows having the cooling fans at various other locations (e.g. at the back of the instrument) leaving the space in front available for other components such as LCD, cables, etc. This aspect can be further understood by referring to FIG. 7, which shows a side view of a testing system 100 that includes a thermal cycling assembly 1 (which includes the electronic board assembly 10 and heat pump 20), and an analysis module 2, that are both enclosed within an outer housing skin 3. As can be understood further by referring to FIG. 10, the analysis module 2 carries the samples within and is translated to the front of the system over the heat pump 20 to facilitate thermal cycling of the samples and then retracts to the rear of the system to facilitate removal of the samples.

Figure 7:
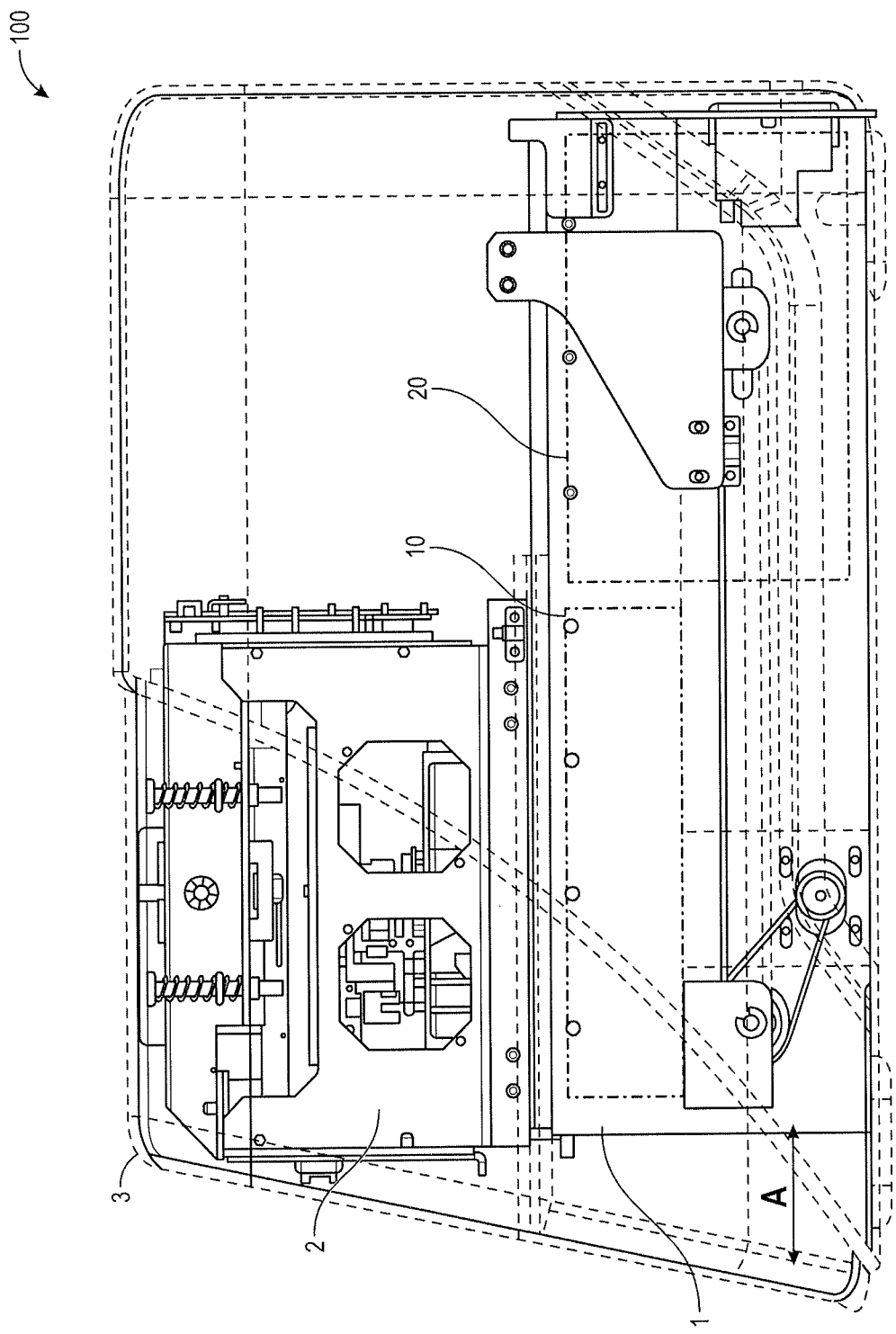
FIG. 7 shows a side view of a system having a thermal management module and analysis module within a housing, in accordance with some embodiments.

As can be seen FIG. 7, there is a void A between the casting of the thermal cycling assembly 1 and the outer skin 3. In some embodiments, one or more interface components can be included, for example within void A, to maintain air flow through the fans and into the flowpaths described above while supporting one or more auxiliary components, such as cables or an LCD screen.

Figure 8:
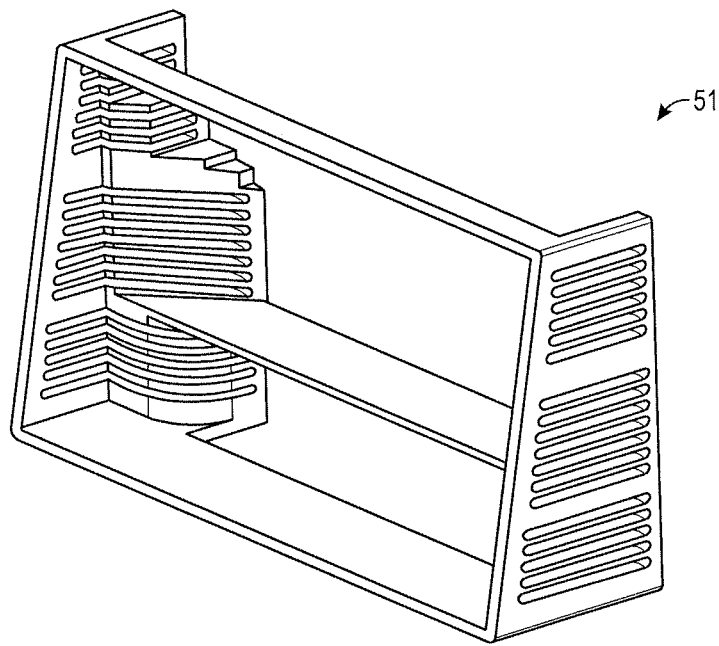
FIGS. 8-9 shows interface components formed by 3D printing for use with the system in FIG. 7, in accordance with some embodiments.
Figure 9:
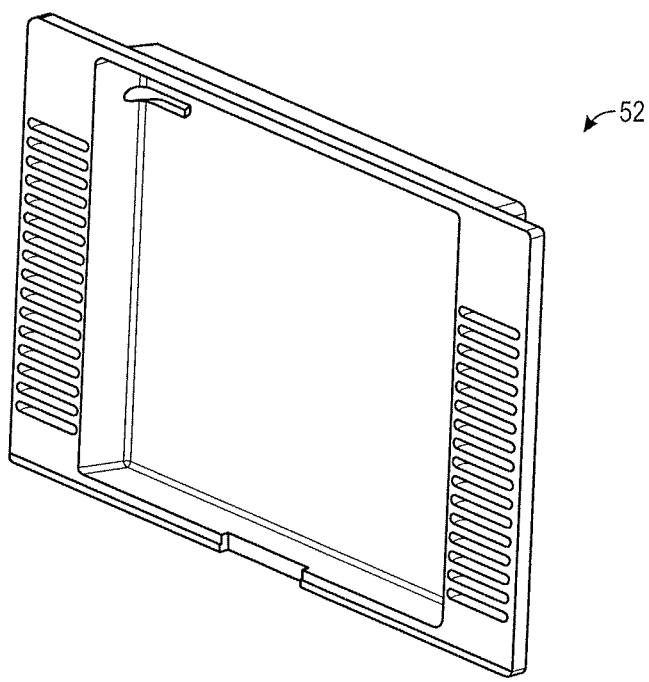

FIGS. 8-9 show interface components, which can be 3D printed or formed by any suitable method. Interface component 51 provides vent opening on the sides to maintain adequate air supply and a middle partition which maintains isolation between the airflows from the heat sink and the electronic board assembly. Interface component 52 fits into component 51 and provide some vent openings on a front face as well as a central square region for supporting an LCD monitor 53, for example, as shown in FIG. 11 (shown with the outer housing skin 3 removed).

Figure 11:
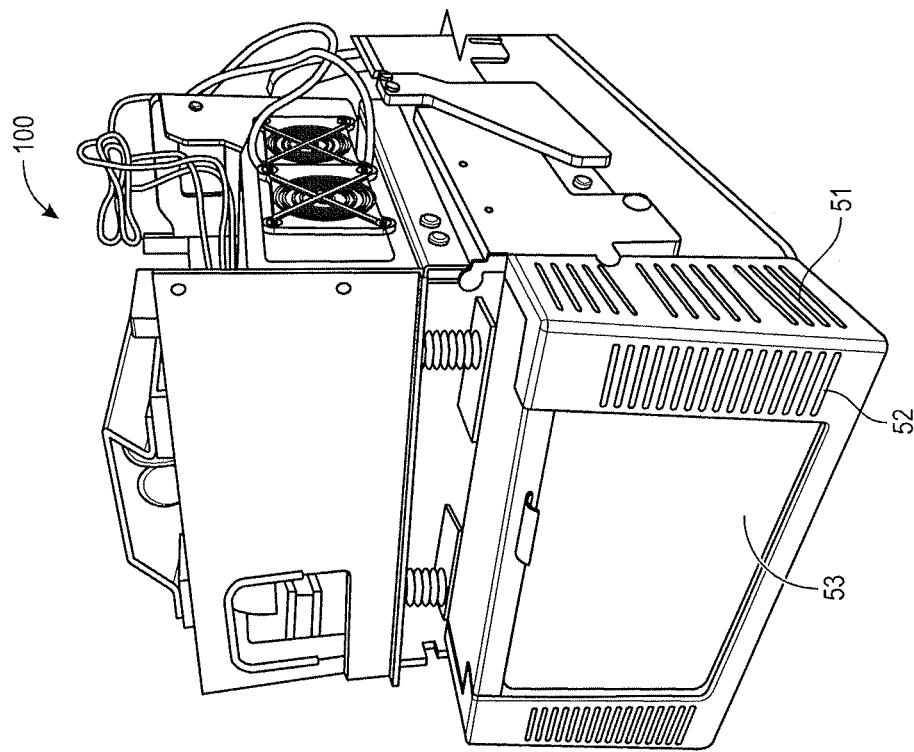
FIG. 11 shows view of a thermal management system with an interface component, in accordance with some embodiments.
Figure 11:
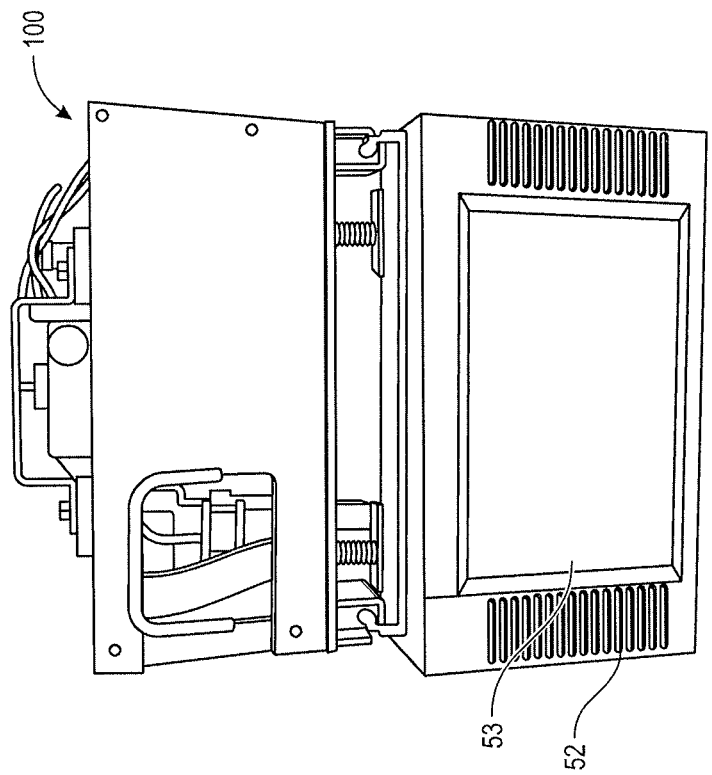
Figure 12A:
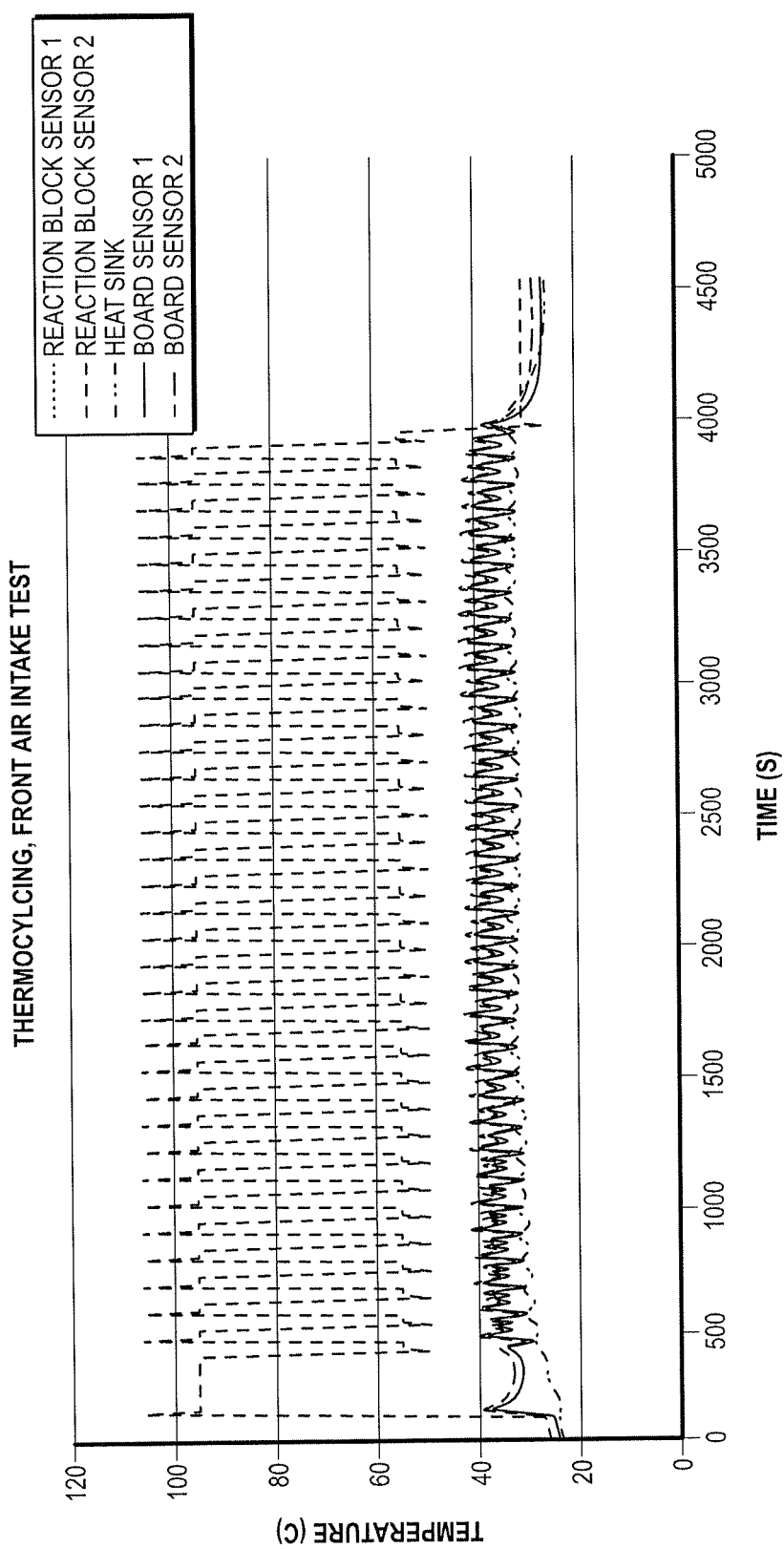
FIGS. 12A-12B shows thermocycling testing data of the setup in FIG. 11 without the interface component.
Figure 12B:
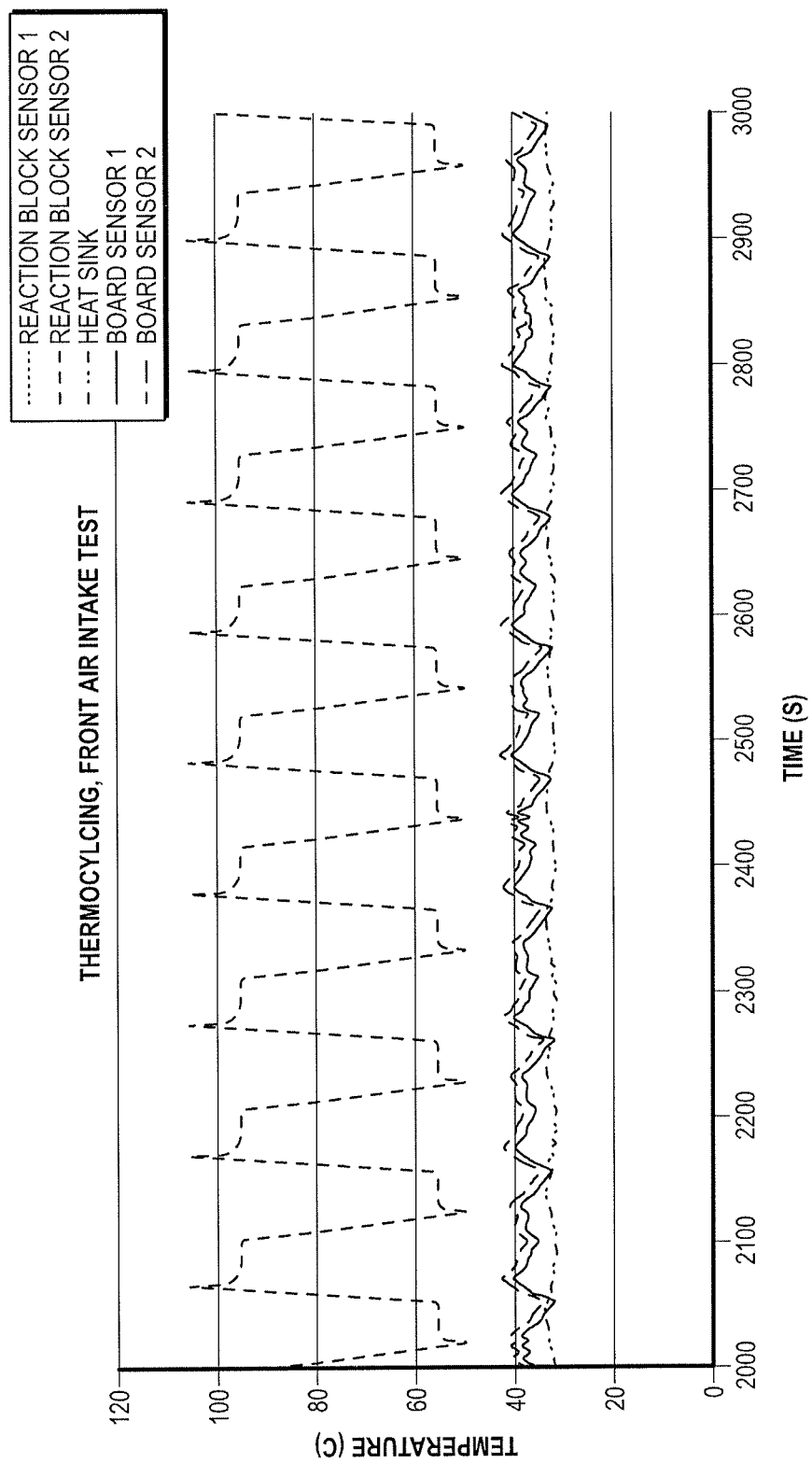
Figure 13A:
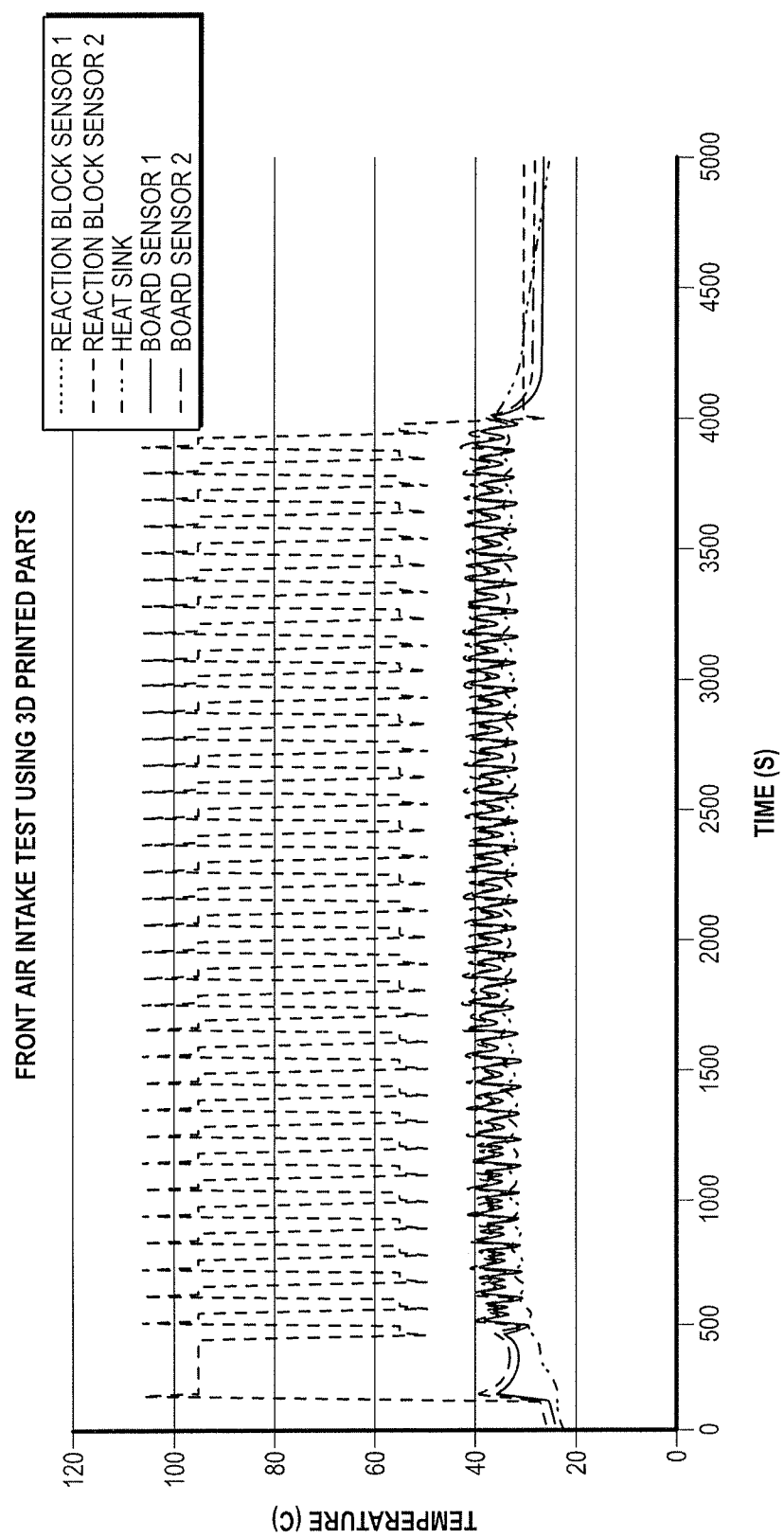
FIGS. 13A-13B shows thermocycling testing data of the setup in FIG. 11 with the interface component.
Figure 13B:
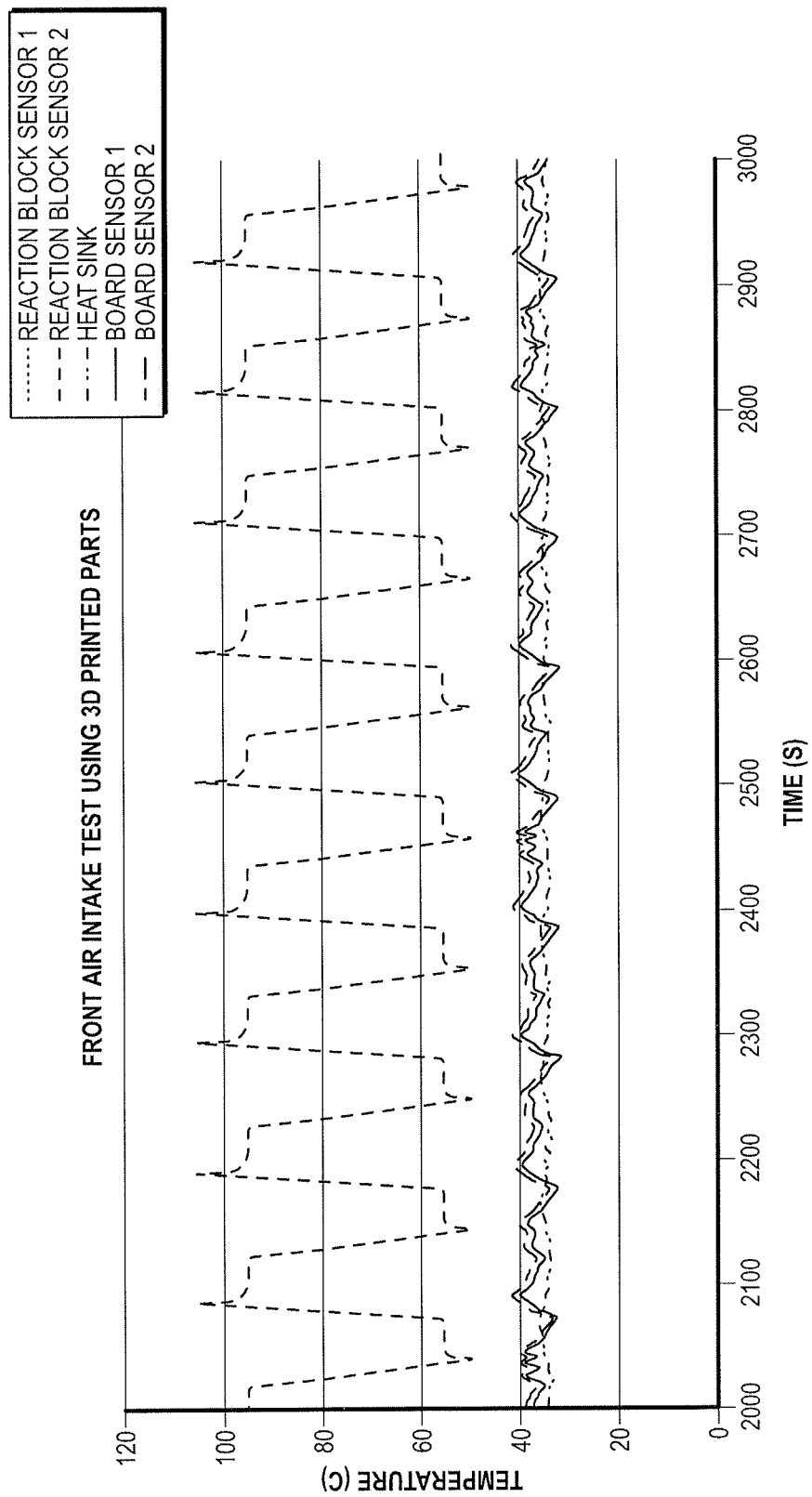

Thermocycling test of the system shown in FIG. 11 are demonstrated in FIGS. 12A-12B and 13A-12B. FIGS. 12A-12B show thermocycling testing without the interface described above, while FIGS. 13A-13B show thermocycling testing of the system of FIG. 11 operating with the interface installed. Thus, with or without the blocking vents provided by the interface, the cooling system performs well and in an efficient manner.

Another technical advantage of the system is that the thermal boards are directly coupled with the heat pump which eliminates any cable routing that might obstruct the airflow. This aspect also allows building the entire assembly of a heat pump, thermal boards, fans, and air tubes as a module that can be convenient for manufacturing and service, for example, the module 2 shown in FIGS. 7 and 10, can be readily removed for repair or replacement.

While the foregoing description describes various alternatives, still further alternatives will be apparent to those who are skilled in the art and are within the scope of the invention.

In the claims appended hereto, the term "a" or "an" is intended to mean "one or more." The term "comprise" and variations thereof such as "comprises" and "comprising," when preceding the recitation of a step or an element, are intended to mean that the addition of further steps or elements is optional and not excluded. All patents, patent applications, and other published reference materials cited in this specification are hereby incorporated herein by reference in their entirety. Any discrepancy between any reference material cited herein and an explicit teaching of this specification is intended to be resolved in favor of the teaching in this specification. This includes any discrepancy between an art-understood definition of a word or phrase and a definition explicitly provided in this specification of the same word or phrase.

What is claimed is:

1. A thermal management assembly comprising:
    an electronics board assembly configured for controlling thermal cycling of a heat pump electrically connected thereto, wherein the electronics board assembly comprises at least two circuit boards with a space therebetween, wherein at least one circuit board includes one or more high power components;
    one or more airflow sources that control airflow from a heat sink of the heat pump when connected to the electronics board assembly; and
    wherein the space between the at least two circuit board is enclosed sufficiently so that a negative pressure within the space by operation of the one or more airflow sources draws air into the space, thereby cooling the electronics board assembly concurrent with cooling of a heat sink of the heat pump during thermal cycling of the heat pump.

2. The thermal management assembly of claim 1 further comprising:
    one or more air tubes or conduits extending between an intake to an outlet, wherein the outlet is positioned near at one end of the electronics board assembly when electrically connected thereto and the intake is positioned near an opposite end of the electronics board assembly further from the heat pump, wherein the negative pressure created within the space draws air into the space from the outlet of the one or more air tubes.

3. The thermal management assembly of claim 2 wherein the one or more air tubes or conduits comprises a pair of air tubes or conduits, one on each side of the electronics board assembly.

4. The thermal management assembly of claim 2 wherein the one or more air tubes or conduits are each positioned along a side of the space defined between the at least two circuit boards, thereby enclosing the space therebetween.

5. The thermal management assembly of claim 2 wherein each of the one or more air tubes or conduit has a square or rectangular cross-section.

6. The thermal management assembly of claim 2 wherein the one or more air tubes or conduits have a cross-sectional shape of any of: a circle, an oval, a triangle, a regular polygon, an irregular polygon, or any combination thereof.

7. The thermal management assembly of claim 2 wherein the outlet of each air tube or conduits is positioned on a side thereof so as to direct the flow of air into the space between the at least two circuit boards.

8. The thermal management assembly of claim 2 wherein each of the one or more air tubes or conduits is fabricated from a thermally conductive material and is thermally coupled to another component to facilitate additional transfer of heat therefrom.

9. The thermal management assembly of claim 1 wherein the electronics board assembly is configured to directly connect to a heat pump such that the electronics board assembly is configured to control the heat pump.

10. The thermal management assembly of claim 1, further comprising:
a partition configured to isolate airflow from a heat sink of a heat pump when connected thereto from airflow drawn through the electronics boards assembly.

11. The thermal management assembly of claim 1, further comprising:
a heat pump having a heat sink.

12. The thermal management assembly of claim 11, wherein the electronics board assembly is directly connected to the heat pump.

13. The thermal management assembly of claim 12, wherein the assembly is provided as a module.

14. The thermal management assembly of claim 2 further comprising:
an outer housing; and
an interface component between the outer housing and one or more air intakes of the one or more air tubes or conduits.

15. The thermal management assembly of claim 14, wherein the interface component comprises one or more components having a middle partition that isolates airflow from the heat sink of the heat pump from air drawn through the electronics board assembly.

16. The thermal management assembly of claim 14, wherein the interface component houses the airflow source, the airflow source comprising at least two fans.

17. The thermal management assembly of claim 14, wherein the interface component supports a user display screen thereon.

18. A method of thermally cooling a heat pump system, the methods comprising:
operating one or more fans to control airflow from a heat sink thereby cooling the heat sink;
controlling airflow from the heat sink so as to cool the heat sink; and
drawing air into a space between two circuit boards in an electronics boards assembly that controls operation of the heat pump, by operating the one or more fans, wherein the space between the two circuit boards is enclosed sufficiently so that operating the one or more fans creates a negative pressure within the space, thereby cooling the electronic board assembly concurrent with cooling of the heat sink.

19. The method of claim 18 wherein the air is drawn through one or more air tubes or conduits.

20. The method of claim 19 wherein the one or more air tubes or conduits comprises a pair of air tubes or conduits, one on one or both sides of the electronics board assembly.

21. The method of claim 19 wherein the one or more air tubes or conduits enclose the space between the two circuit boards so as to create the negative pressure.

22. A method of thermally cooling a heat pump system, the methods comprising:
operating one or more fans to control airflow from a heat sink thereby cooling the heat sink;
controlling airflow from the heat sink so as to cool the heat sink;
drawing air into a space between two circuit boards in an electronics boards assembly that controls operation of the heat pump, by operating the one or more fans, thereby cooling the electronic board assembly concurrent with cooling of the heat sink; and
isolating airflow from the heat sink from air drawn through the electronics board assembly by a partition.

* * * * *